(12) United States Patent
Cheah et al.

(10) Patent No.: US 10,396,038 B2
(45) Date of Patent: Aug. 27, 2019

(54) FLEXIBLE PACKAGING ARCHITECTURE

(71) Applicant: INTEL CORPORATION, Santa Clara, CA (US)

(72) Inventors: Bok Eng Cheah, Bayan Lepas (MY); Jackson Chung Peng Kong, Tanjung Tokong (MY); Shanggar Periaman, Gelugor (MY); Michael Skinner, San Jose, CA (US); Yen Hsiang Chew, Georgetown (MY); Kheng Tat Mar, Air Itam (MY); Ridza Effendi Abd Razak, Lunas (MY); Kooi Chi Ooi, Glugor (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/505,901

(22) PCT Filed: Sep. 26, 2014

(86) PCT No.: PCT/US2014/057648
§ 371 (c)(1),
(2) Date: Feb. 22, 2017

(87) PCT Pub. No.: WO2016/048347
PCT Pub. Date: Mar. 31, 2016

(65) Prior Publication Data
US 2017/0345763 A1    Nov. 30, 2017

(51) Int. Cl.
*H01L 25/10* (2006.01)
*H01L 23/538* (2006.01)
(Continued)

(52) U.S. Cl.
CPC ...... *H01L 23/5387* (2013.01); *H01L 23/3736* (2013.01); *H01L 23/4985* (2013.01);
(Continued)

(58) Field of Classification Search
CPC ............ H01L 23/5387; H01L 23/5388; H01L 23/4985; H01L 23/49572; H01L 23/49855;
(Continued)

(56) References Cited

U.S. PATENT DOCUMENTS 2,949,283 A    8/1960    Smith
3,307,783 A    3/1967    Wiebelt
(Continued)

FOREIGN PATENT DOCUMENTS

CN    1731915 A    2/2006
EP    0611129 A2    8/1994
(Continued)

OTHER PUBLICATIONS

Search Report from counterpart Russian Patent Application No. 2015136239, dated Oct. 19, 2016, 2 pages.
(Continued)

*Primary Examiner* — Michael M Trinh
(74) *Attorney, Agent, or Firm* — Schwabe, Williamson & Wyatt, P.C.

(57) ABSTRACT

A flexible packaging architecture is described that is suitable for curved package shapes. In one example a package has a first die, a first mold compound layer over the first die, a wiring layer over the first mold compound layer, a second die over the wiring layer and electrically coupled to the wiring layer, and a second mold compound layer over the second die.

11 Claims, 9 Drawing Sheets

(51) Int. Cl.
  *H01L 23/495* (2006.01)
  *H01L 25/065* (2006.01)
  *H01L 23/00* (2006.01)
  *H01L 23/373* (2006.01)
  *H01L 23/498* (2006.01)
  *H01L 21/48* (2006.01)

(52) U.S. Cl.
  CPC ........ *H01L 23/49572* (2013.01); *H01L 24/16* (2013.01); *H01L 24/18* (2013.01); *H01L 24/19* (2013.01); *H01L 25/0652* (2013.01); *H01L 25/0655* (2013.01); *H01L 25/0657* (2013.01); *H01L 21/4846* (2013.01); *H01L 23/5389* (2013.01); *H01L 2224/16145* (2013.01); *H01L 2224/16225* (2013.01); *H01L 2224/16227* (2013.01); *H01L 2224/16235* (2013.01); *H01L 2224/18* (2013.01); *H01L 2224/24137* (2013.01); *H01L 2224/73259* (2013.01); *H01L 2924/15311* (2013.01)

(58) Field of Classification Search
  CPC ............. H01L 23/3675; H01L 23/3736; H01L 23/3735; H01L 25/0652; H01L 25/0655; H01L 25/0657; H01L 2224/18; H01L 2224/24051; H01L 2224/24116; H01L 2224/16225; H01L 2224/16227; H01L 2224/16141; H01L 2224/16148; H01L 24/18; H01L 24/16
  See application file for complete search history.

(56) References Cited

U.S. PATENT DOCUMENTS

| | | | |
|---|---|---|---|
| 3,359,145 A | 12/1967 | Salyer et al. | |
| 3,762,946 A | 10/1973 | Stow et al. | |
| 4,170,677 A | 10/1979 | Hutcheson | |
| 4,548,862 A | 10/1985 | Hartman | |
| 4,644,101 A | 2/1987 | Jin et al. | |
| 4,737,112 A | 4/1988 | Jin et al. | |
| 5,126,286 A | 6/1992 | Chance | |
| 5,353,498 A | 10/1994 | Fillion et al. | |
| 5,401,672 A | 3/1995 | Kurtz et al. | |
| 5,430,614 A | 7/1995 | Difrancesco | |
| 5,509,815 A | 4/1996 | Jin et al. | |
| 5,661,042 A | 8/1997 | Fang et al. | |
| 5,668,409 A | 9/1997 | Gaul | |
| 5,769,996 A | 6/1998 | McArdle et al. | |
| 5,773,755 A | 6/1998 | Iwatare | |
| 5,786,979 A | 7/1998 | Douglass | |
| 5,916,641 A | 6/1999 | McArdle et al. | |
| 5,973,923 A | 10/1999 | Jitaru | |
| 5,975,922 A | 11/1999 | Jin | |
| 6,016,250 A | 1/2000 | Hanners | |
| 6,042,894 A | 3/2000 | Goto et al. | |
| 6,128,188 A | 10/2000 | Hanners | |
| 6,219,243 B1 | 4/2001 | Ma | |
| 6,264,476 B1 | 7/2001 | Li et al. | |
| 6,325,552 B1 | 12/2001 | Brillhart | |
| 6,330,157 B1 | 12/2001 | Bezama et al. | |
| 6,340,113 B1 | 1/2002 | Avery et al. | |
| 6,346,750 B1 | 2/2002 | Jiang et al. | |
| 6,479,890 B1 | 11/2002 | Trieu et al. | |
| 6,524,115 B1* | 2/2003 | Gates ................ G01R 1/0408 439/66 |
| 6,574,114 B1 | 6/2003 | Brindle et al. | |
| 6,586,836 B1 | 7/2003 | Ma et al. | |
| 6,611,050 B1 | 8/2003 | Ference et al. | |
| 6,628,522 B2 | 9/2003 | Trautman et al. | |
| 7,033,184 B2 | 4/2006 | Cornell | |
| 7,550,901 B2 | 6/2009 | Chrysler et al. | |
| 7,612,443 B1 | 11/2009 | Bernstein et al. | |
| 7,778,029 B2 | 8/2010 | Ueno | |
| 7,815,998 B2 | 10/2010 | Simpson et al. | |
| 8,018,048 B2* | 9/2011 | Tamaki ............... H01L 25/0652 257/70 |
| 8,434,692 B2 | 5/2013 | Scott et al. | |
| 8,482,107 B2 | 7/2013 | Rokuhara et al. | |
| 8,609,532 B2 | 12/2013 | Swaminathan et al. | |
| 8,623,265 B2 | 1/2014 | Simpson | |
| 8,623,700 B1 | 1/2014 | Bernstein et al. | |
| 8,701,973 B2 | 4/2014 | Kuramoto et al. | |
| 8,998,454 B2* | 4/2015 | Wang .................... F21V 19/003 362/249.02 |
| 9,142,478 B2* | 9/2015 | Kim ....................... H01L 23/36 |
| 2005/0110140 A1 | 5/2005 | Kuo et al. | |
| 2005/0264307 A1 | 12/2005 | Setaka | |
| 2006/0011383 A1 | 1/2006 | Noguchi | |
| 2006/0071349 A1 | 4/2006 | Tokushige et al. | |
| 2006/0076655 A1 | 4/2006 | Fernandez | |
| 2006/0091538 A1 | 5/2006 | Kabadi | |
| 2007/0023907 A1 | 2/2007 | Fork et al. | |
| 2007/0023909 A1 | 2/2007 | Fork et al. | |
| 2007/0065984 A1 | 3/2007 | Lau et al. | |
| 2007/0134947 A1 | 6/2007 | Neidlein | |
| 2007/0158807 A1 | 7/2007 | Lu et al. | |
| 2007/0177298 A1 | 8/2007 | Jaatinen et al. | |
| 2007/0227669 A1 | 10/2007 | Nishi | |
| 2008/0017971 A1 | 1/2008 | Hollis | |
| 2008/0205004 A1 | 8/2008 | Ueno | |
| 2008/0258313 A1 | 10/2008 | Ali et al. | |
| 2008/0315388 A1 | 12/2008 | Periaman et al. | |
| 2009/0321044 A1 | 12/2009 | Hernon | |
| 2010/0089468 A1 | 4/2010 | Scott | |
| 2010/0112774 A1 | 5/2010 | Oh et al. | |
| 2010/0129995 A1 | 5/2010 | Im et al. | |
| 2010/0164671 A1 | 7/2010 | Pagani et al. | |
| 2010/0181644 A1 | 7/2010 | Toong et al. | |
| 2010/0270668 A1 | 10/2010 | Marcoux | |
| 2010/0301475 A1 | 12/2010 | Hsu et al. | |
| 2011/0057284 A1 | 3/2011 | Brodie | |
| 2011/0115078 A1 | 5/2011 | Jeong et al. | |
| 2011/0278351 A1 | 11/2011 | Aleksov et al. | |
| 2011/0281407 A1 | 11/2011 | Forbes et al. | |
| 2012/0170231 A1 | 7/2012 | Lee | |
| 2012/0283799 A1 | 11/2012 | Fan | |
| 2012/0309684 A1 | 12/2012 | Wood et al. | |
| 2012/0313236 A1 | 12/2012 | Wakiyama et al. | |
| 2013/0100392 A1 | 4/2013 | Fukushima | |
| 2013/0185935 A1 | 7/2013 | Eichelberger et al. | |
| 2013/0207249 A1 | 8/2013 | Vindasius et al. | |
| 2013/0214385 A1 | 8/2013 | Do et al. | |
| 2014/0168902 A1* | 6/2014 | Park ....................... H01L 23/367 361/719 |
| 2014/0246788 A1 | 9/2014 | Kim et al. | |
| 2014/0319702 A1 | 10/2014 | Yang et al. | |
| 2014/0327155 A1 | 11/2014 | Kang et al. | |
| 2015/0171028 A1* | 6/2015 | Jo ......................... H01L 23/562 257/713 |

FOREIGN PATENT DOCUMENTS

| | | |
|---|---|---|
| EP | 2006910 | 12/2008 |
| JP | 2001284564 | 10/2001 |
| JP | 3359910 | 12/2002 |
| JP | 3802936 | 8/2006 |
| JP | 2012114334 | 6/2012 |
| JP | 2013136821 | 7/2013 |
| JP | 2014029958 | 2/2014 |
| KR | 2008-0069484 | 7/2008 |
| KR | 2011-0101430 | 9/2011 |
| KR | 2012-0043367 | 5/2012 |
| RU | 1489397 | 4/1995 |
| WO | WO 99/38211 A1 | 7/1999 |
| WO | 2015094259 | 6/2015 |

OTHER PUBLICATIONS

International Searching Authority at the Korean Intellectual Property Office, International Search Report and Written Opinion for (56) References Cited

OTHER PUBLICATIONS

PCT International Patent Application No. PCT/US2014/057648, dated Jun. 26, 2015, 16 pages.
International Searching Authority at the Korean Intellectual Property Office, International Preliminary Report on Patentability for PCT International Patent Application No. PCT/US2013/076397, dated Jun. 21, 2016, 6 pages.
International Searching Authority at the Korean Intellectual Property Office, International Search Report and Written Opinion for PCT International Patent Application No. PCT/US2013/076397, dated Sep. 18, 2014, 8 pages.
Maxfield, 2D vs. 2.5D vs. 3D ICs 101, Apr. 8, 2012, 8 pages, EETimes website article published online and available at: http://www.eetimes.com/document.asp?doc_id=1279540 8 pages.
White, Separate the Hype From the Reality in 3D-ICs. Jun. 15, 2012, electronicdesign.com article published online and available at: http://electronicdesign.com/boards/separate-hype-reality-3d-ics, 5 pages.
Karnezos, 3-D Packaging: Where All Technologies Come Together, Jul. 16, 2004, Electronic Manufacturing Technology Symposium, 4 Pages.
Japan Patent Office, Office Action for Japanese Patent Application No. 2016-550460, dated Dec. 6, 2016, 6 pages.
Office Action from Chinese Patent Application No. 201480010686.0, dated Apr. 17, 2018, 8 pages.
Search Report from European Patent Application No. 14882778.5, dated Mar. 22, 2017, 9 pages.
Office Action from Japanese Patent Application No. 2016-550460, dated Dec. 6, 2016, 12 pages.
Notice of Allowance from Japanese Patent Application No. 2016-550460, dated May 16, 2017, 3 pages.
Office Action from Korean Patent Application No. 10-2015-7023069, dated Aug. 4, 2016, 17 pages.
Office Action from Korean Patent Application No. 10-2015-7023069, dated Apr. 21, 2017, 11 pages.
Office Action from Korean Patent Application No. 10-2015-7023069, dated Oct. 27, 2017, 7 pages.
Office Action from Korean Patent Application No. 10-2015-7023069, dated Dec. 14, 2017, 7 pages.
Notice of Allowance from Russian Application No. 2015136239, dated Feb. 17, 2017, 8 pages.
Office Action from Taiwan Patent Application No. 104127741, dated Jun. 16, 2016, 14 pages.
Office Action from Taiwan Patent Application No. 104127741, dated Jun. 20, 2017, 10 pages.
Office Action from Taiwan Patent Application No. 104127741, dated May 23, 2018, 3 pages.
Office Action from Chinese Application No. 201480010686 (Attorney Docket No. P70851), mailed Apr. 2, 2019, 9 pp.

* cited by examiner

FLEXIBLE PACKAGING ARCHITECTURE

CROSS-REFERENCE TO RELATED APPLICATION

This patent application is a U.S. National Phase Application under 35 U.S.C. § 371 of International Application No. PCT/US2014/057648, filed Sep. 26, 2014, entitled FLEXIBLE PACKAGING ARCHITECTURE.

FIELD

The present disclosure relates to the field of semiconductor chip packaging and, in particular, to packaging that is flexible for curved package shapes.

BACKGROUND

Semiconductor and micromechanical dies or chips are frequently packaged for protection against an external environment. The package provides physical protection, stability, external connections, and in some cases, cooling to the die inside the packages. Typically the chip or die is attached to a substrate and then a cover that attaches to the substrate is placed over the die. Alternatively, the die is attached to a cover and then a package substrate is formed on the die.

There is a trend to add more functions to each die and to put more than one die in a single package. This causes the packages to be larger and also increases specialization for packages. While a very high volume product, such as a cellular telephone may benefit from highly specialized purpose built components, a low volume product does not. For lower volume and more specialized products, it may be less expensive to select from multiple existing smaller dies. This allows more flexibility in the functions provided for the product and allows the product to use smaller packaged dies.

Current packaging technologies use rigid pre-impregnated fiberglass or silicon to carry different dies and to connect the dies to each other. This provides a stable platform to hold the dies and for the wiring layers used by the dies. However, a rigid substrate requires a wide, flat, and rigid location to be mounted in a device. As the Internet of Things, further automation, and connectivity expand, microelectronics are desired for a wider variety of different things. These microelectronic applications may include clothing, writing accessories medical devices, and a wide range of small pocketable and wearable things. Many such things do not provide a wide, flat, rigid location for a device package.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

A method to assemble low-profile and highly integrated systems for wearable device applications is described. Multiple layers of flexible thin-film substrate with embedded silicon devices interconnect through one or more flexible interposers. The silicon devices may include central processing units, memory, sensors and power management controllers, among others. The low-profile flexible package has one or more thin-film thermal distribution layers at the top or bottom of the packaging system.

This provides highly-integrated and low-profile wearable devices using embedded-die thin films and flexible interposers. The thermal conditions for the silicon devices are improved using the thin-film thermal distribution layers. In addition, highly heterogeneous devices may be integrated. The device and the input/output functionality may be segmented using different silicon devices and by repartitioning functional IP-blocks. The overall system is flexible to bend into various locations and may be provided to market in a shorter time compared to highly complex system-on-chip (SOC) packages that have a significantly larger silicon footprint.

When the package is bent to fit into an unconventional location, the limitations on cooling may limit the power and performance of a system such as a SoC processor. By using a molded region of a stacked die package assembly as both a package level integrated heat spreader and also an additional ground plane to provide improved signal return paths and noise shielding of the entire package assembly, the heat can more easily be dissipated from the silicon devices. For higher performance an additional heat sink may be coupled to the package level integrated heat spreader.

Figure 1A:
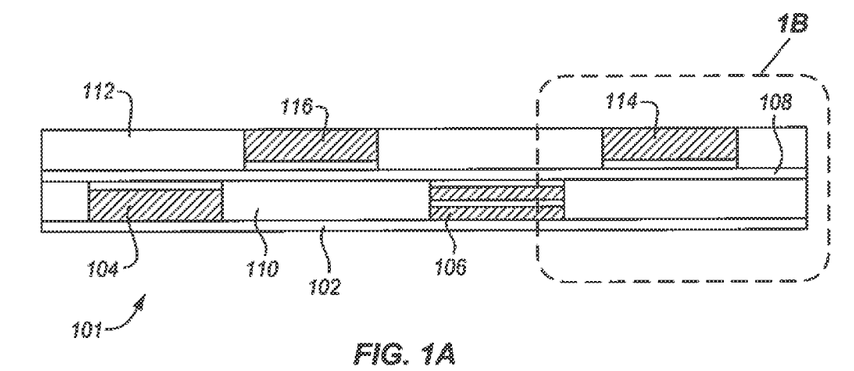
FIG. 1A is a cross-sectional side view diagram of a flexible package according to an embodiment.

FIG. 1A is a cross-sectional side view diagram of a package 101 for silicon dies that is able to accommodate a variety of different form factors. The package has two layers L1, L2 to show how multiple dies may be combined into multiple layers. However, in some embodiments, one only layer L1 is required. The base 102 of the package is a thermal distribution layer formed of a thermally conductive material such as silver or copper plating. A flexible interposer 108 is positioned between the two layers L1, L2.

The two layers are each formed of a flexible substrate 110, 112. Silicon dies are embedded into the substrate which may be formed of a variety of different materials such as a poly resin mold compound. The first layer L1 is shown as having a first die 104 attached to the flexible interposer 108 and a die stack 106 coupled to the interposer. The dies may be attached using a surface mount, ball grid, thermal compression bonding, surface activated bonding, or any other attachment approach. In the die stack the lower die is attached to the upper die using pads on the lower die and through-silicon vias on the upper stack. An interposer or any other desired technique may alternatively be used to couple the two dies.

In the second layer L2, two additional dies 114, 116 are also embedded into the flexible substrate in the same way as the dies in the first layer. This allows all of the dies to be coupled to any other dies or any desired external device. In this example all of the wiring connections are through the flexible interposer that runs between the two layers. The dies are embedded in the encapsulant layer 110, 112 so that they are held securely in place and in connection with the interposer. Encapsulant layers serve as the package substrate in this example. The interposer and the encapsulant are flexible so that the package can be shaped into any desired form. The thermal distribution layer 102 is applied to one or both of the encapsulant layers to dissipate heat from the dies to the external ambient. As shown it is attached to the lower layer L1.

Figure 1B:
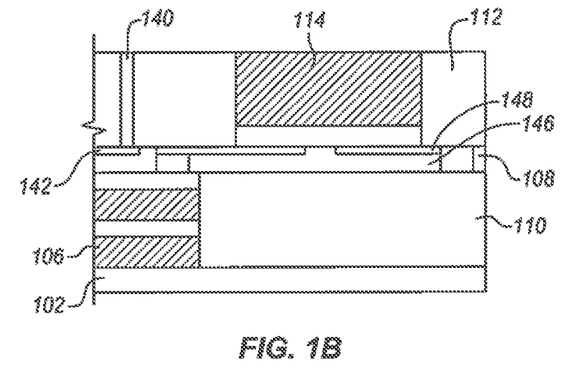
FIG. 1B is an enlarged view of a portion of FIG. 1A according to an embodiment.

FIG. 1B shows a portion of the package of FIG. 1A in more detail. As shown, the flexible interposer 108 may have metal routing layers 142. The metal routing layers may be in one or more layers of the interposer. A dielectric material 146 may be used between the metal layers. The metal layers may include pads 148 to attach to contact or lands (not shown) of the dies 114 or die stacks 106, and pads to connect to vias 140. The via may be bored, etched, or drilled through the encapsulant layer to form connections for an external system or component. The via may also be used to connect to the heat spreader to conduct heat from the interposer and from a die connected to the interposer to the heat spreader. The via may also have a contact that makes a connection to another part of the package when the package is folded or rolled into its final configuration as described in more detail below.

Figure 2A:
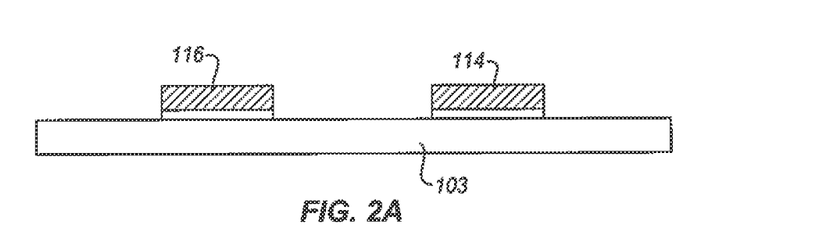
FIGS. 2A to 2G are a sequence of side view diagrams of stages of forming the flexible package of FIG. 1A according to an embodiment.

FIGS. 2A to 2H show a simplified assembly process flow for a flexible or rollable system-in-package (SiP) 101 for wearable applications. FIG. 2A is a cross-sectional side view diagram of a temporary carrier 103. One or more silicon devices 114, 116, such as CPU, PCH, sensors, wireless chip and DRAM memory are attached to the carrier by adhesive, solder, or in any other way. The temporary carrier 103 may be metal, silicon, or any other suitably rigid material. The silicon devices may also include embedded dies 106 in a stacked configuration. The stacked dies may have vertical through silicon via interconnections to each other. Any of the silicon devices may have contact on top or bottom surfaces to connect with other devices in the package or with external devices.

Figure 2B:
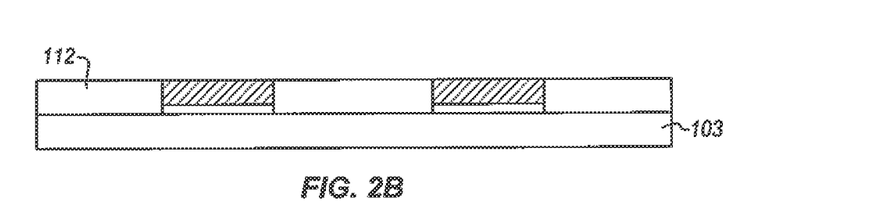

In FIG. 2B, the dies are embedded in a substrate 112. The thin-film flexible substrate is a flexible encapsulant that protects the dies and electrically isolates the dies and any other layers from each other. The encapsulant may be made of any of a variety of different materials, including polyester (Mylar), polyimide (Kapton), aramid, fiber-glass epoxy and silicone composites. Alternative materials include poly siloxanes, epoxy resins, acrylates e.g. poly methyl methacrylate, both UV curable and $O_2/H_2O$ initiated, polyurethanes, benzocyclobutene (BCB), polyimide, polyamide, high-density polyethylene (HDPE), bismaleimide-triazine (BT) resin, liquid crystal polymer (LCP), aramide, and polydimethylsiloxane (PDMS). The flexible encapsulant may be semi-cured during this process step depending on the material selection.

Figure 2C:
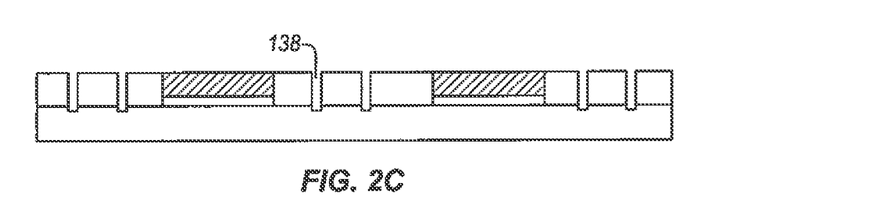

In FIG. 2C, vertical channels 138 are formed through the encapsulant to the temporary carrier 103. The vertical channels may be drilled mechanically or optically by a laser or formed in any other way. The vertical channels may be in any desired patter or structure depending on the particular implementation. In addition additional channels may be drilled to improve the flexibility of the package. Kerfs may be drilled or cut through the encapsulant to allow the encapsulant to be compressed into the kerf when folded or rolled. The kerfs may be straight sided or angled so that the kerf is wider at its opening.

Figure 2D:
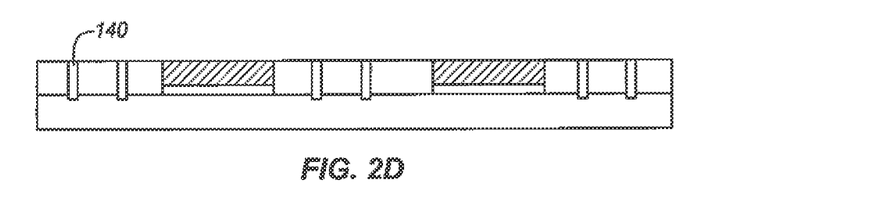
Figure 2E:
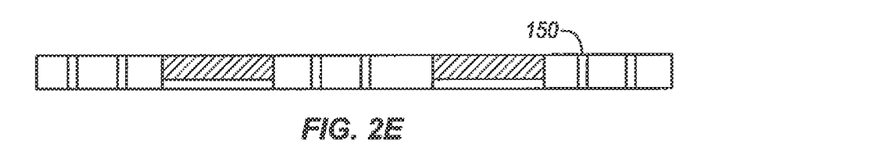

In FIG. 2D, the channels are filled with a conductor, such as copper, to create conductive vias through the encapsulant. This may be done using any of a variety of different filling and deposition processes, including chemical and plasma vapor deposition. The vias may be filled or plated depending on the desired electrical characteristics. In FIG. 2E, electrical contact points 150 are applied to the top of each via and the carrier is removed. The carrier may be removed by releasing the adhesive, etching, or in other ways.

Figure 2F:
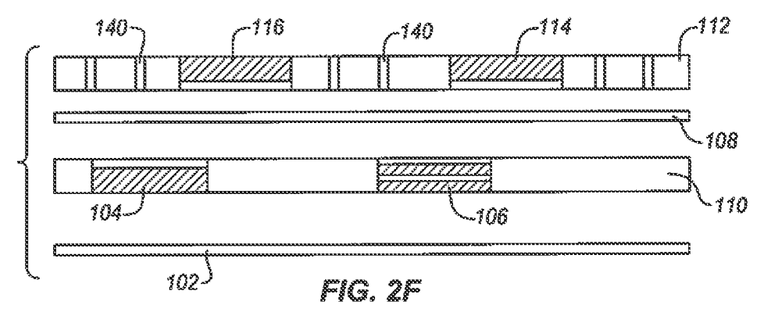

FIG. 2F is an exploded side view diagram of multiple layers L1, L2 of the package. The thin-film flexible substrate is prepared as one or more, in this case two, thin layers 110, 112 with silicon devices 104, 106, 114, 116 embedded in the substrate.

FIG. 2F also shows the interposer 108 between the two layers 110, 112. Electrical interconnections between the silicon devices in the thin-film flexible substrate layers (L1/L2) may be made using the metal routing layers of the flexible interposer layer. The flexible interposer layer has embedded redistribution metal layers 142 (e-RDL) that provide the electrical path between the silicon devices. The thin-film flexible substrate and interposer may be formed of elastomer-based material compounds. While two layers are shown more or fewer may be used by adding additional layers of substrate with interposer between each layer. This allows for more layers of thin-film flexible substrate layers.

The flexible or rollable package 100 also includes one or more thin-film thermal distribution layers or heat spreaders 102 at the package base or top layer. The thin-film thermal distribution layer may be formed of silver or copper-based composites or nano-composites to provide efficient heat distribution across the device. The thin-film thermal distribution layer may also or alternatively be attached to the package top layer in another embodiment. In another embodiment, the thermal distribution layer for example a silver or copper plate, may be formed directly on the back-surface of the base package layer 110 through an electroplating, sputtering, or deposition process.

As mentioned above, to improve the flexibility of the package, kerfs (not shown) may be cut into one or both of the encapsulant or flexible substrate portions of the package. The kerfs are cut into the encapsulant on the inside of the rolled portion, in this example the bottom of the die. This may be done before the optional heat spreader is applied to this surface and before the flexible interposer is placed between the two substrates. The kerfs may be cut as v-shaped channels or grooves in a lateral direction or in other words parallel to the axis about which the package is bent or rolled.

Figure 2G:
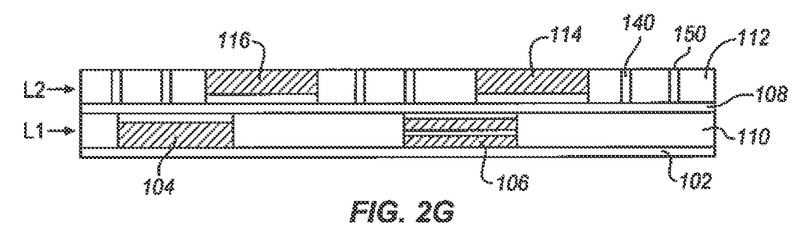

In FIG. 2G, the components are joined together. This is a simplified diagram to indicate the relative positions of the components after being joined together and is essentially the same as FIG. 1A. The substrate layers with the embedded dies are joined to the interposer and coupled to the redistribution layers in the interposer. In one example, the interposer and redistribution layers are formed over one of the substrate layers such as the base layer 110. The second substrate layer may then be attached over the base layer. The thin-film substrate, interposer and thermal distribution layers may be aligned and integrated through any of a variety of different bonding processes, including for example surface activated bonding (SAB) or thermal compression bonding (TCB). The thermal distribution layer may optionally be then added to one or the other outer surfaces by plating, for example.

Figure 2H:
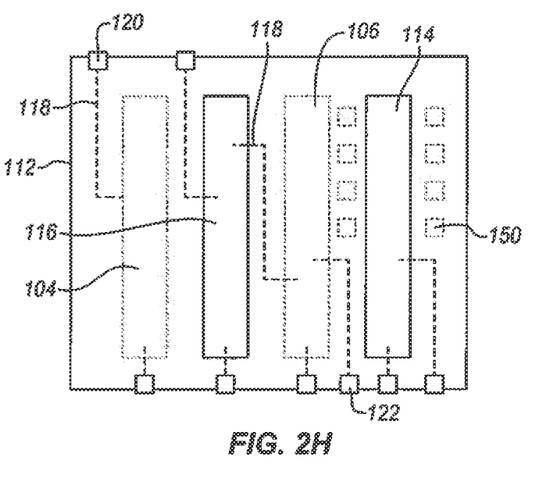
FIG. 2H is a top view diagram of the flexible package of FIG. 2G according to an embodiment.
Figure 2I:
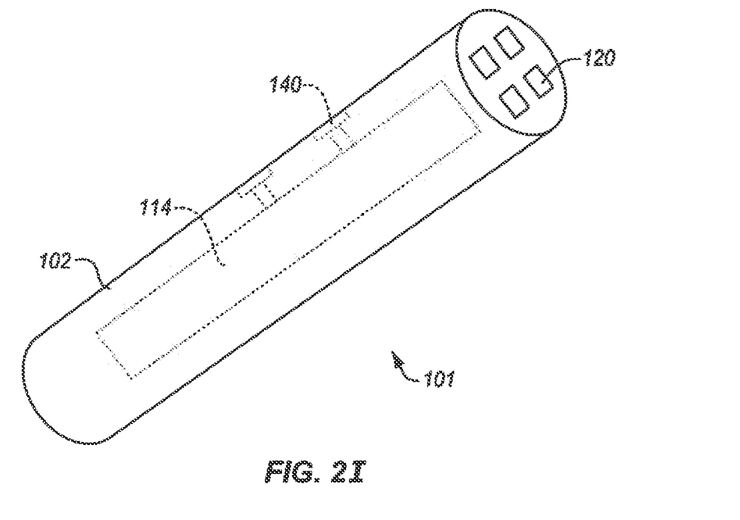
FIG. 2I is a top view of the flexible package of FIG. 2G after rolling according to an embodiment.

FIG. 2H is a top plan view of the assembled package of FIG. 2G. As shown in FIGS. 2G and 2I, the silicon devices alternate in position between the two substrates. This provides a higher degree of device flexibility and a greater bending-angle. The silicon devices are positioned in an alternating configuration so that a die is not directly over another die and so that there is a space between each die within the same substrate.

FIG. 2H shows the two dies 104, 106 of the lower substrate 110 and the two dies 114, 116 of the upper substrate 112. The dies are connected with a simplified pattern of connection lines 118 to connect the silicon devices to each other and also to any external devices. In the illustrated example, there are two groups of external connectors 120, 122, one at each end of the package. This allows for more convenient connections in some applications. Power may be supplied at one end and data at the other for example. The two different connection areas may be divided in any suitable way to fit any desired form factor. The surface pads 150 which connect to the tops of vias 140 are also shown. The surface contact pads are particular useful for external connections with a curved, folded, or bent package configuration.

In FIG. 2I, the package 101 has been rolled into a cylindrical shape so that the base layer 110 and the thin film heat spreader 102 are on the outside of the cylindrical package. The low-profile flexible package is first shaped by a suitable process, such as rolling. Then the shaped package may then be cured to retain the desired form. The curing process may be used, for example, to harden the substrate material so that it holds its shape.

Figure 2J:
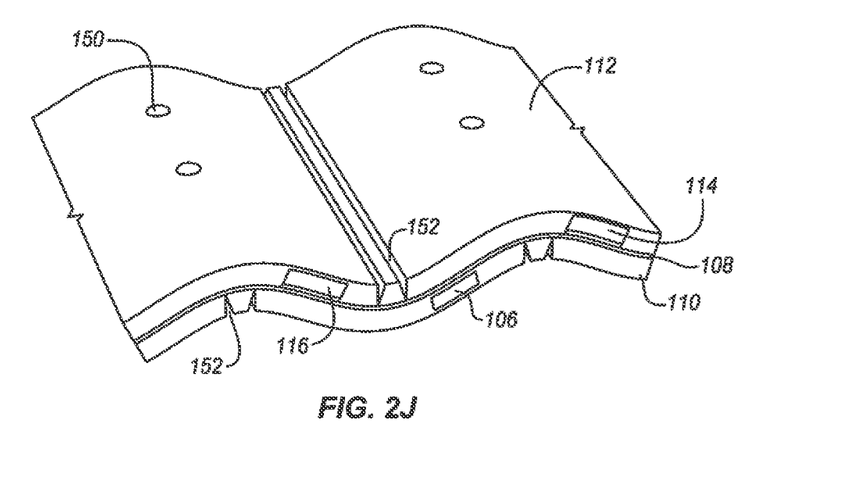
FIG. 2J is a top view partially cut away of the flexible package of FIG. 2G after curving according to an embodiment.

FIG. 2J is a cross-sectional diagram of an alternate curved package shape that may be formed instead of the rolled shape of FIG. 2I. FIG. 2J shows the two encapsulant layers 110, 112 which are formed into a curved or wavy shape. The curvature package is allowed to bend in part using kerfs 152 sliced through one or both of the encapsulant layers. The kerfs reduce the compression of the encapsulant when the encapsulant is bent. The silicon devices 116, 106, 114 are not required to bend. The alternating position allows the encapsulant to bend around the devices. The contact pads 150 allow for external connections.

A flexible and a rollable package have a variety of different applications. The cylindrical configuration allows the SiP to be used in a variety of different wearable applications such as a smart-pen with various communication, authentication, or security capabilities. Such a package may also be used in other wearable applications such as fabric, glasses, shoes, wallets and wrist-bands. The package may instead be bent into other curved shapes that are not cylindrical. The package may be curved in more than one direction so that it is able to fit into other curved shapes.

Figure 3:
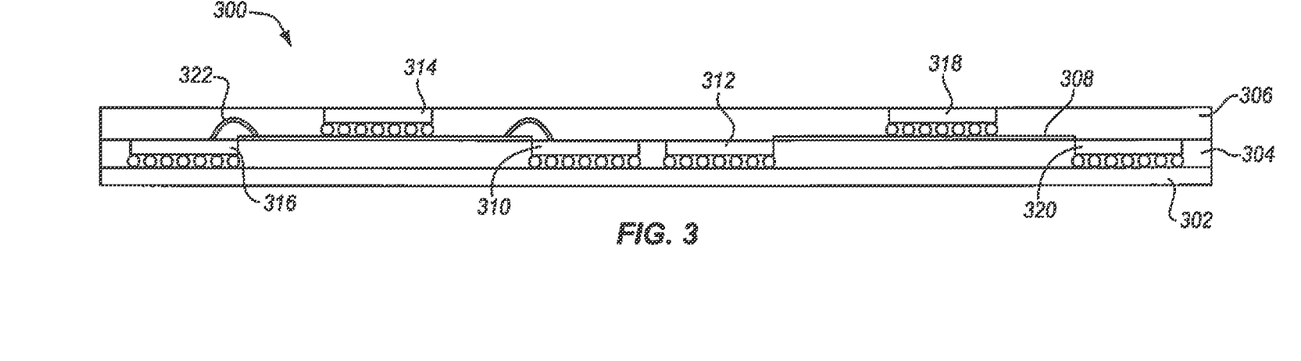
FIG. 3 is a cross-sectional side view diagram of an alternative flexible package according to an embodiment.

FIG. 3 is a cross-sectional side view diagram of an alternate configuration for a flexible package. The package has a package substrate 302. Silicon devices are connected to the substrate with a ball grid, land grid, or other attachment technology. The dies are then embedded in a layer of encapsulant 304 that covers the dies and the substrate. The encapsulant may be the same materials as mentioned above, or a mold compound may be used in this example as well as that of FIGS. 1A and 1B. Metal pads and routes 324 are then formed over the first layer of mold compound. Additional silicon devices are connected to the metal pads in a manner similar to how the devices were coupled to the substrate. A second layer of mold compound 306 is formed over the devices and the first mold compound to seal the package and hold the devices in place.

As in the example of FIG. 2J, kerfs may be cut into the top of the upper mold compound 306. Additional kerfs may be cut into the top of the lower mold compound 304 before the wiring layers 324 are added.

Figure 4:
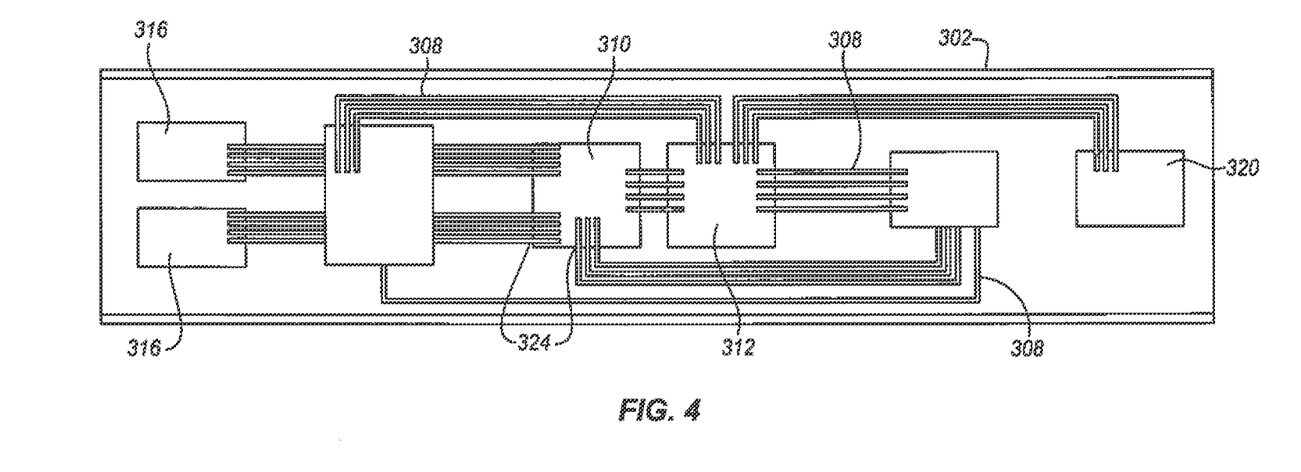
FIG. 4 is top view diagram of the flexible package of FIG. 3 according to an embodiment.

FIG. 4 shows the same package as a top view in which the top layer of mold compound 306 is transparent. In this view each of the silicon devices may be seen. The metal pads and routing layers on the mold are shown in top view to show how silicon devices may be connected using pads for solder ball or wire bond connections.

The electrical paths in the package mold compound provide an additional avenue for establishing direct electrical connections between modules or dies in a multi-chip (or multi-chip stacked die) package assembly. This may be used instead of a specific interposer layer. As shown in FIG. 3, the mold compound is used as the substrate for the routing layers and pads.

As described, the bottom dies are first attached to the package substrate. The remaining structure is then overmolded. Photolithography may then be used on the mold compound to form metal pads and metal routes. These metal pads and metal routes on the mold compound function to electrically connect dies of the multi-chip package. In addition to the metal routes, the active side or back side of a die may be electrically connected using through-silicon vias. The metal pads may be connected using solder balls or wire bonding 322, or in any other desired way.

The substrate may be a conventional mini PCB (core or coreless) with overlaying layers of dielectric and metal routing stacked up and a solder-resist layer on the top and bottom surfaces. The substrate may be a conventional package substrate adapted for flexibility. The substrate may also be a flexible PCB with metal routings or redistribution metal layers (e.g. wire meshes or metal traces) encapsulated within an elastomer compound. As mentioned above, the mold compound may be any polymer/poly-resin mold compound or an elastomer compound, among others.

FIG. 3 shows a multi-chip package assembly with multiple dies attached to the package substrate 302 as a cross-sectional side view. The dies provide enough components to form a powerful connected computing system. The silicon devices include a processor 310, chipset or co-processor 318, memory 314, radio 320, MEMs/sensors 316, power controller 312, and any other desired components. The metal pads and metal routes are laid on the mold compound and function as electrical interconnects between the various modules or silicon devices on the multi-chip package.

The metal routing layer increases the total number of electrical paths for inter-module communications and may be used in stacked or single layer packages. The increase in electrical paths facilitates higher density module integration in a multi-chip package assembly for wearable devices. Fewer electrical paths may limit the number of modules that can be effectively integrated into a single multi-chip package assembly. The connections formed on the mold compound may be shorter and more direct. The modules may be directly connected to each other by metal routes on the mold compound without having to go through an intermediate die or a package substrate. This improves communication speed and efficiency between the modules of the package.

In addition, the thickness and the number of metal layers of a package substrate may be reduced by moving some metal routings from the package substrate 302 to the package mold 304. This reduces the amount of substrate required which reduces the cost of the multi-chip package assembly.

Figure 5A:
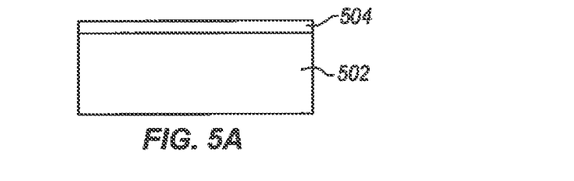
FIGS. 5A to 5P are cross-sectional side view diagrams of stages of an example process flow of performing photolithography on mold compound to produce wire routing shown for the package of FIG. 4 according to an embodiment.
Figure 5B:
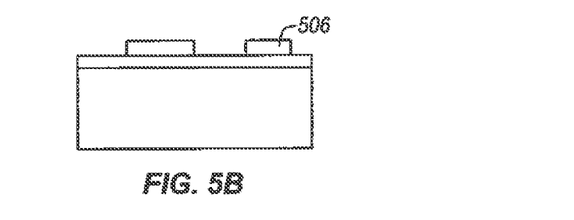
Figure 5C:
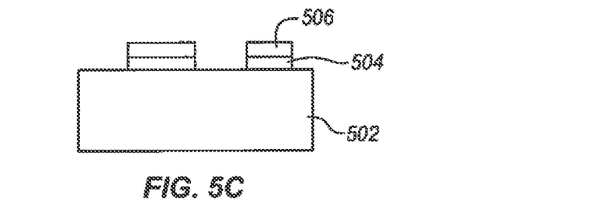
Figure 5D:
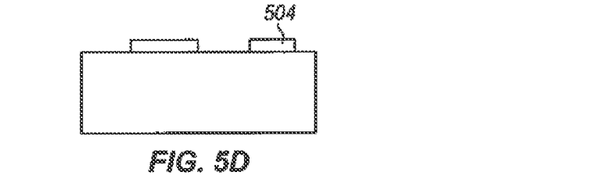

FIGS. 5A to 5F are cross-sectional side view diagrams to show an example process flow of performing photolithography on mold compound to produce the wire routing shown, for example, in FIG. 4. In FIG. 5A a passivation layer 504 is coated over the mold compound 502. The embedded dies and package substrate are not shown for simplicity. The passivation layer 504 may be made from silicon dioxide (SiO2) and other dielectric or insulation materials. In FIG. 5B a photoresist layer 506 is applied over the passivation layer 504, exposed and developed to produce the desired pattern. In FIG. 5C, the passivation layer 504 is patterned based on the patterned photoresist 506 by removing the exposed passivation layer 504. In FIG. 5D, the photoresist layer 506 is removed leaving the patterned passivation layer.

Figure 5E:
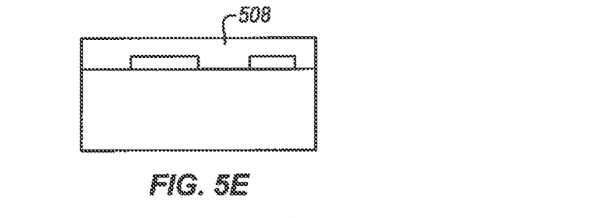
Figure 5F:
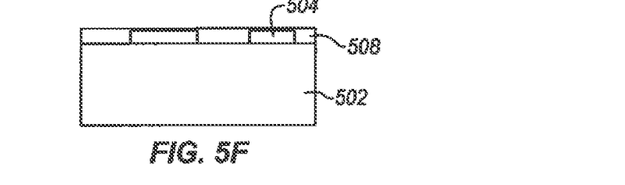

In FIG. 5E a copper layer or other conductive material layer 508 is coated over the passivation layer 504. The metal routing is then finished by backgrinding the copper down to the level of the passivation layer 504. This leaves a pattern of copper 508 with dielectric between the copper. The copper may be formed into pads, lines and any other desired shape based on what is possible for the photoresist. The metal routing layers may be formed in any other desired way. This process flow is provided only as an example. The same techniques may be used to form the redistribution layer on the interposer of FIG. 1. In addition more layers may be applied over the pattern of FIG. 5E to produce more complex wiring layers and multiple levels of patterns.

Figure 6:
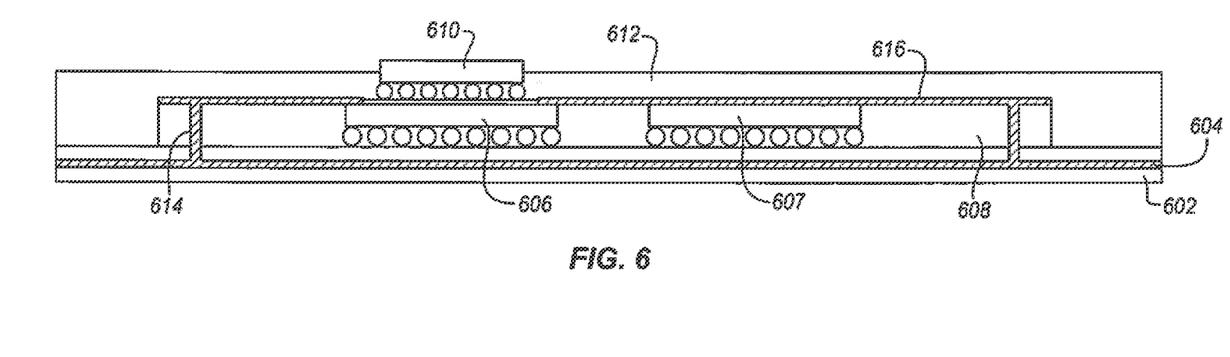
FIG. 6 is a cross-sectional side view diagram of an alternative flexible package according to an embodiment.

FIG. 6 is a cross-sectional diagram of another flexible package or a part of a package. The package has a substrate 602 with a ground plane 604. The package may have many more layers for interconnecting silicon devices or it may just provide ground or power or both. One or more silicon devices 606, 607 are connected to the substrates using a ball or land grid array. A first layer of mold compound 608 is then formed over these dies.

The package as shown includes a stacked die assembly with a top die 610 coupled to respective bottom die 606. There may be more than one stack, depending on the particular implementation. The dies are stacked with connections from a solder ball of the top die to a through-silicon via of the bottom die. However, any other die connection may be used including those shown in FIGS. 1 and 3.

The package assembly is molded with a bottom layer mold compound 608 that spreads across a wide surface area of the package substrate 602 compared to the surface area of the bottom dies 606. The z-height of the bottom layer mold compound is slightly higher than the Z-height of the bottom dies so that the mold compound completely covers the bottom dies.

In the example of FIG. 6, the bottom layer molded region of the package may be used as an integrated heat spreader. Special insulation materials with good heat transfer characteristics may be used as the package bottom layer mold compound. An additional heat conductive layer 616, for example a metal such as copper or aluminum, may be laid, plated, sputtered, or deposited on top of the bottom layer molded region of the package assembly to further spread heat across the entire surface area of the bottom layer molded region through a heat conduction process. Heat from a bottom die may be conducted onto the bottom layer mold compound and spread across the entire surface area of the molded region's metal layer surface to be dissipated through a natural heat dissipation process.

A second thin layer of high heat conduction molding compound 612 may be formed over the top of the bottom layer molded region 608 to protect the metal layers 616 and still provide good heat dissipation for the entire package assembly. The metal layers 616 include heat spreader layers and connection interfaces or redistribution layers between dies, such as between the dies 606, 610 on the left side of the diagram and the die 607 on the right side of the diagram.

In one embodiment, the metal layer 616 on the package bottom layer molded region is electrically connected to the package substrate ground plane 604 using wirebond or laser drilled vias 614 through the bottom layer mold compound 608. This connection provides additional heat dissipation channels within the package through the heat spreader layer 616. The connection also provides additional signal return paths (for improved electrical performance) and shielding from electromagnetic interference from other communication silicon devices within the SiP.

Figure 7:
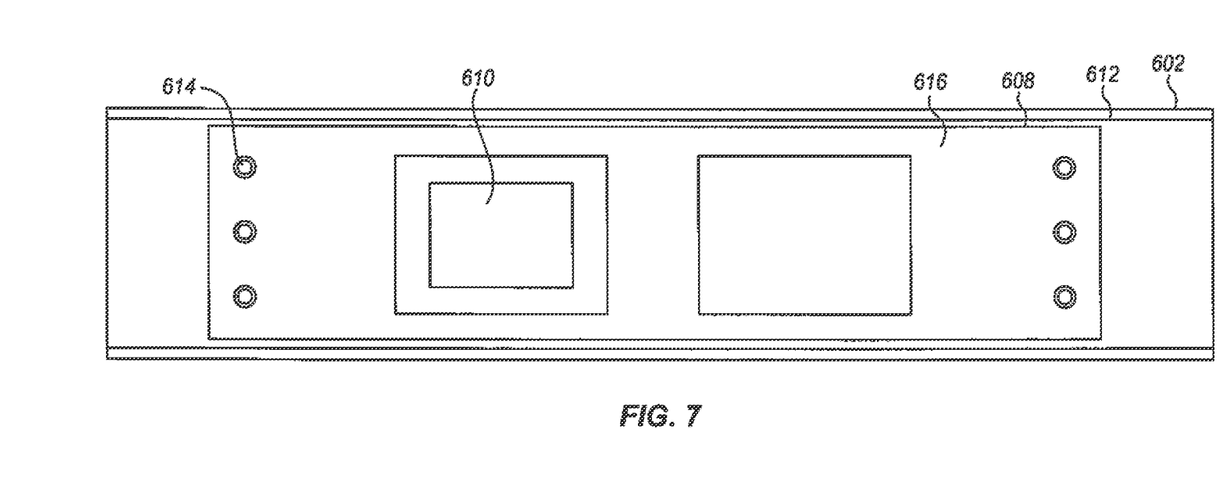
FIG. 7 is top view diagram of the flexible package of FIG. 6 according to an embodiment.

FIG. 7 is a top plan view of the package in which the upper layer molded region is transparent. The two silicon devices are shown as near each other. Both are surrounded by the heat spreader layer 616. The through-mold visa 614 may be plated to improve conduction. There may be more than the three vias as shown. Vias may also be added between the two dies.

The mold compound 608, 612 in both layers is a thermal conductor with high heat transfer characteristics and may also be an electrical insulator. This allows the devices 606, 610 to cool through the mold compound. The package may be finished with an additional thermal heat spreader layer (not shown), such as a metal (e.g. copper) layer. The metal may be laid on top of the mold compound 612 which functions as an on-mold heat spreader. The metal layer may be electrically connected to the package substrate ground pins to provide additional signal return paths and electromagnetic interference shielding layer.

The added heat spreader layer 616 increases the natural heat dissipation capabilities of a multi-chip stacked die package assembly. This allows a multi-chip stacked die package assembly to house higher TDP silicon modules for wearable devices. The added heat spreader layer also increases the effectiveness of the noise shielding of a multi-chip stacked die package assembly. The ground reference plane requirements for a package substrate (or PCB) can be effectively reduced. This allows the substrate thickness and the number of layers to also be reduced reducing the overall cost of the package.

Figure 8A:
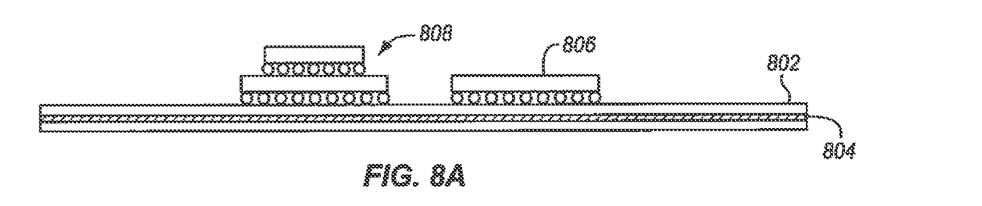
FIGS. 8A to 8E are a sequence of side view diagrams of stages of forming the flexible package of FIG. 6 according to an embodiment.

FIGS. 8A to 8E are cross-sectional side view diagrams of a simplified fabrication process flow for the package of FIGS. 8 and 9. In FIG. 8A, the dies 806, 808 are attached to the package substrate 802. The substrate has already been formed and includes a ground plane 804 and connection pads for the dies. The dies may be attached using any of the techniques mentioned above, depending on the intended application and the nature of the dies. Two of the dies 808 are stacked. More or fewer die stacks may be used, depending on the overall system design.

Figure 8B:
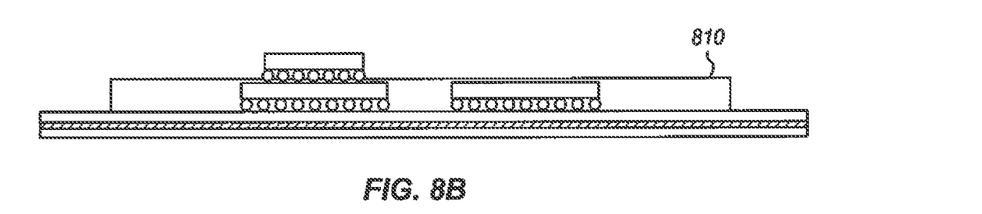
Figure 8C:
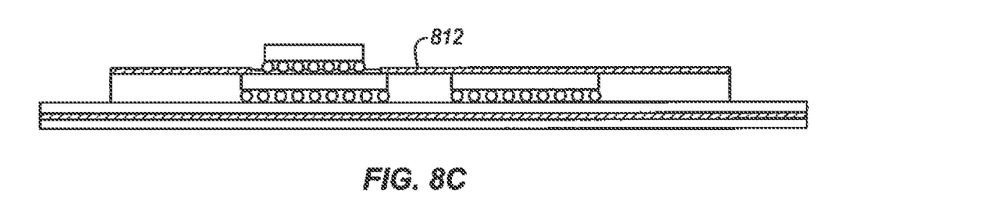

In FIG. 8B, a lower mold compound layer 810 is formed over the substrate and the dies. The mold compound in the illustrated example covers most of the substrate and covers the lower levels of the dies. In FIG. 8C a copper layer or any other suitable heat conductive layer 812 is formed over the mold compound 810. This is the integrated heat spreader described above. Optionally, a portion of the heat spreader layer may be used for routing layers and metal pads.

Figure 8D:
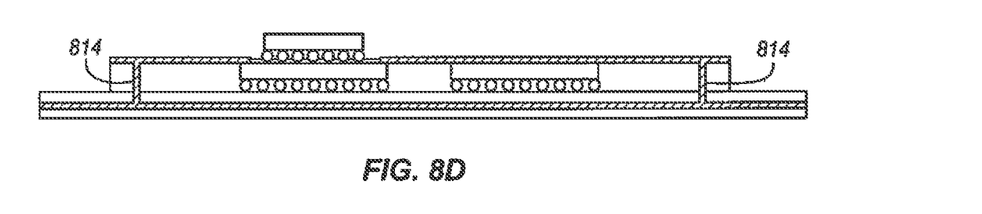
Figure 8E:
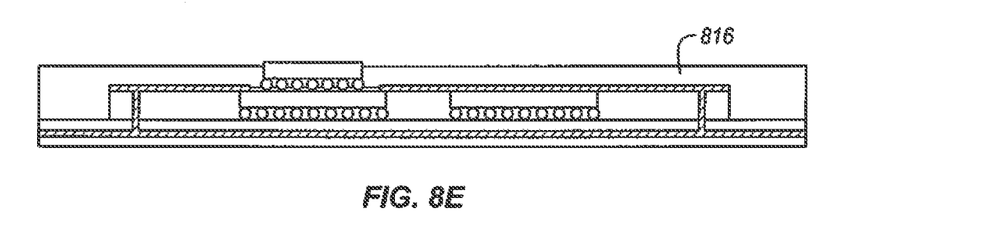

In FIG. 8D, through-mold vias are formed through the heat spreader layer and the mold. The vias extend all the way down to the ground plane 804 of the substrate 802. The vias are then filled or plated to ensure that they are electrically conductive and connect the heat spreader layer to the ground plane. In FIG. 8E a second layer of mold compound 816 is added over the dies and the heat spreader layer. This layer covers the entire substrate and can act as a protective layer over all the rest of the structure.

After the structure of FIG. 8E is obtained, the entire SIP may be shaped to any suitable configuration to fit a desired form factor. The SiP may be rolled as in FIG. 2I, bent, curved, or folded as desired.

The RDL layers described herein may have a first dielectric layer closest to the chip, a conductor layer with metal pathways, and a solder stop layer. The chip is connected to the metal pathways by vias through the first dielectric layer. The metal pathways may be formed of any of a variety of different metals including copper, aluminum, titanium, tungsten, nickel, palladium, gold, or of metal alloys including one or more of copper, aluminum, titanium, tungsten, nickel, palladium, and gold. The RDL may be in the form of a package substrate, a BBUL (Bumpless Build-Up Layer), or alternating patterns of dielectric and conductive layers formed over the die. The particular choice or RDL may be adapted to suit any of a variety of different package types.

The mold or molding compound described herein may be formed of any of a variety of different materials, depending on the nature of the package and its intended use. Suitable mold compounds may include, or may consist of, a plastic material, such as a thermosetting polymer or an epoxy resin or a filled epoxy resin such as a thermosetting mold compound. Alternatively, an underfill or other material may be used to protect the die.

The metal layer described herein for heat spreading, additional routing paths, and noise shielding may be copper, aluminum, gold, or any other electrically conductive material including non-metals. It may be applied by sputtering, by deposition, or in a variety of other ways. The metal layer may physically contact and electrically connects with the ground layer of the RDL The packages described herein may be further finished with additional coatings or covers. The package may be covered with another layer of mold compound or it may be covered with a molded polymer cover or both, depending on the particular type of package. In addition, additional dies, RDLs, passive components, or other elements may be added to the package to form a system in a package, or multi-chip packages of different types. The metal layers may be covered with polymer or dielectric resins for protection and the vias may be filled to provide protection and physical stability to the package. Alternatively, the vias may be filled with metal instead of coated with metal.

Figure 9:
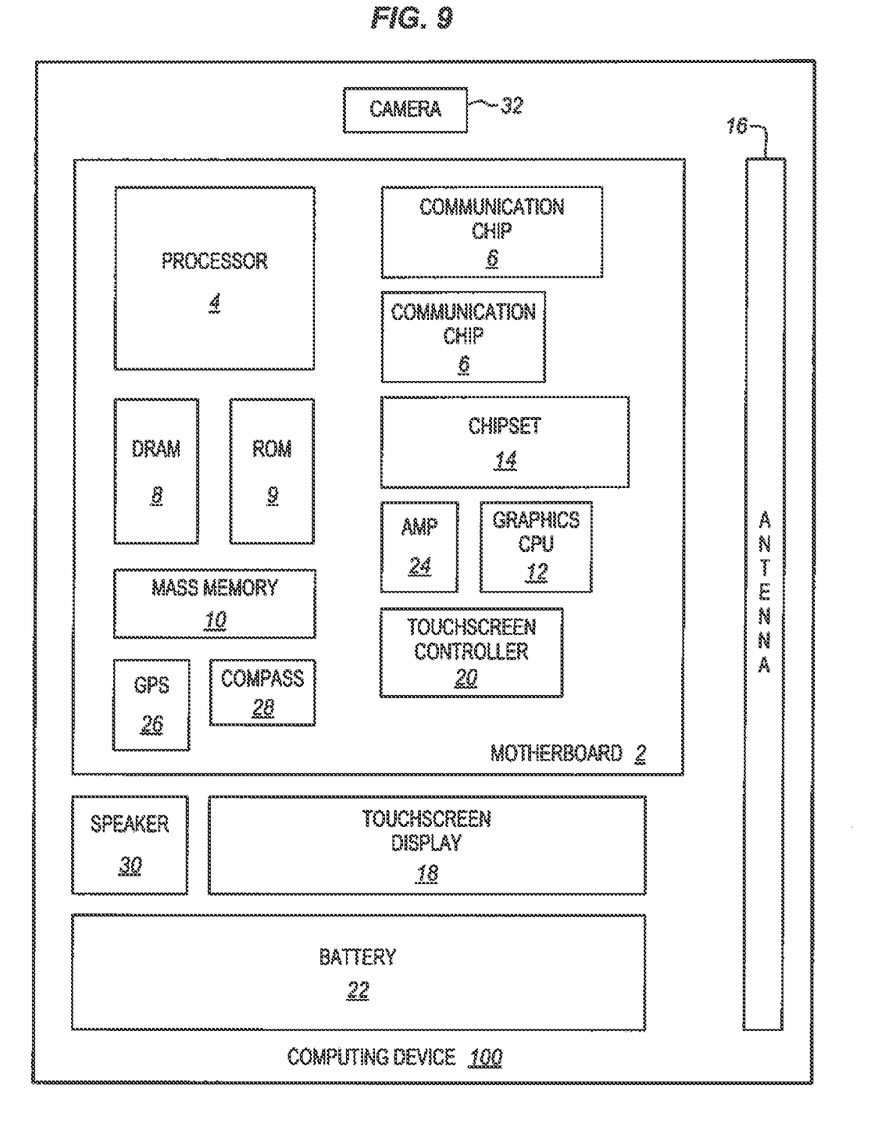
FIG. 9 is a block diagram of a computing device incorporating a package with an integral EMI shield according to an embodiment.

FIG. 9 illustrates a computing device 100 in accordance with one implementation of the invention. The computing device 100 houses a system board 2. The board 2 may include a number of components, including but not limited to a processor 4 and at least one communication package 6. The communication package is coupled to one or more antennas 16. The processor 4 is physically and electrically coupled to the board 2. At least one of either the RF or digital die packages shielded using a pattern of metal lined vias in the package and the metal layer and electrically coupled to the board 2 through the package. In some implementations of the invention, any one or more of the components, controllers, hubs, or interfaces are formed on dies using metal coated through mold vim as described above.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (OPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The entire system 100 or any part of the system may be constructed as a bendable, flexible, or rollable package. One portion of the system may be provided on a rigid board while another portion of the system is provided on a flexible or shaped board.

In various implementations, the computing device 100 may be a laptop, a netbook, a notebook, an ultrabook, a smartphone, a tablet, a personal digital assistant (PDA), an ultra mobile PC, a mobile phone, a printer, a scanner, a monitor, a set-top box, an entertainment control unit, a digital camera, a portable music player, or a digital video recorder. In further implementations, the computing device 100 may be any other electronic device, such as a pen, a wallet, a watch, or an appliance that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a method that includes embedding a plurality of silicon dies in a flexible substrate, forming a flexible interposer layer over the embedded dies, forming a thin film thermal distribution layer over the substrate opposite the flexible interposer layer, shaping the substrate with the dies and the interposer, and curing the shaped substrate.

Further embodiments include stacking another die over one of the plurality of silicon dies, or forming a through-silicon via in one of the plurality of dies and electrically connecting the via to the stacked die.

In further embodiments, the flexible interposer comprises an embedded redistribution metal layer to provide an electrical path to the flexible substrate. The flexible interposer comprises an elastomer to carry the metal layer. Forming the flexible interposer comprises forming a plurality of alternating metal and dielectric layers. The thin film thermal distribution layer comprises a copper-based composite.

Further embodiments include bonding the plurality of silicon dies to the flexible interposer.

In further embodiments bonding comprises surface-activated bonding or thermal compression bonding. Shaping comprises rolling.

Some embodiments pertain to a package that includes a plurality of silicon dies embedded in a flexible substrate, a flexible interposer layer over the embedded dies, a thin film thermal distribution layer over the substrate opposite the flexible interposer layer, the flexible substrate being shaped with the dies and the interposer to a curved shape and cured so that the flexible substrate holds its shape.

In further embodiments at least one die of the plurality of silicon dies is stacked over another die.

Further embodiments include a through-silicon via to connect the stacked die to another die.

In further embodiments the flexible interposer comprises an embedded redistribution metal layer to provide an electrical path to the flexible substrate. The flexible interposer comprises an elastomer to carry the metal layer. The flexible interposer comprises a plurality of alternating metal and dielectric layers. The thin film thermal distribution layer comprises a copper-based composite. The plurality of silicon dies are electrically coupled and bonded to the flexible interposer. The bond is by surface-activated bonding or thermal compression bonding.

Further embodiments include a second plurality of silicon dies embedded in a second flexible substrate, the second substrate being in electrical contact with the flexible interposer opposite the first silicon substrate. Further embodiments include a thin film thermal distribution layer over the second substrate opposite the flexible interposer.

Some embodiments pertain to an electronic computing system that has a power supply, a display and a semiconductor computing device package having a plurality of silicon dies embedded in a flexible substrate, a flexible interposer layer over the embedded dies, and a thin film thermal distribution layer over the substrate opposite the flexible interposer layer, the flexible substrate being shaped with the dies and the interposer to a curved shape and cured so that the flexible substrate holds its shape.

Some embodiments pertain to a method that includes attaching a plurality of dies to a substrate, overmolding the attached dies, forming metal pads and routing on the mold compound, and connecting at least one die of the plurality of dies to the formed metal pads and routing.

Further embodiments include forming the metal pads and routing comprising using photolithography.

In further embodiments forming the metal pads and routing comprises applying metal over a patterned passivation layer and backgrinding the metal layer. Connecting comprises connecting using a wirebond between a pad on the respective die and a formed metal pad on the mold compound. Connecting comprises connecting a through-silicon via in the respective at least one die to a formed metal pad. Attaching an additional die over formed metal pads on the molding compound.

Some embodiments pertain to a package that includes a first die, a first mold compound layer over the first die, a wiring layer over the first mold compound layer, a second die over the wiring layer and electrically coupled to the wiring layer, and a second mold compound layer over the second die.

In further embodiments, the first die is electrically coupled to the wiring layer. The first die is electrically coupled to the wiring layer through a through silicon via in the first die that extends from a top surface of the first die to circuits within the first die. The second die is electrically coupled to the wiring layer through wiring pads formed on the bottom of the second die.

Further embodiments include a flexible substrate below the first die.

In further embodiments the flexible substrate is thermally conducting and thermally coupled to the first die.

Further embodiments include a through-mold via to couple the wiring layer to the flexible substrate In further embodiments the flexible substrate comprises a redistribution layer and is electrically coupled to the first die. The redistribution layer is coupled to the first die by wirebonds. The second die is not over the first die and the second die is laterally displaced from the first die.

Further embodiments include an electrical contact area over the first mold compound coupled to the wiring layer to connect the second die to an external device.

Further embodiments include a flexible interposer over the first mold compound layer and wherein the wiring layer is formed over the flexible interposer.

Further embodiments include a third die over the wiring layer and wherein the second die and the third die are coupled by the wiring layer.

In further embodiments, the wiring layer comprises metal pad to electrically connect to the second die.

Some embodiments pertain to an electronic computing system that includes a power supply, a display, and a semiconductor computing device package having a first die, a first mold compound layer over the first die, a wiring layer over the first mold compound layer, a second die over the wiring layer and electrically coupled to the wiring layer, and a second mold compound layer over the second die.

Some embodiments pertain to a method that includes attaching a plurality of dies to a substrate, overmolding the attached dies and the substrate with a thermally conductive mold compound, and depositing a thermally conductive layer as a heat spreader over the mold compound.

In further embodiments, the mold compound is filled with thermally conductive materials to conduct heat from the dies to the heat spreader. The heat spreader is formed of a thermally conductive material, such as copper or aluminum.

Further embodiments include forming a thermally conductive via through the mold compound before depositing to connect the heat spreader to the substrate.

In further embodiments, the substrate comprises a ground plane and the via is coupled to the ground plane of the substrate.

Some embodiments pertain to a package that includes a substrate, a die on the substrate and connected to the substrate, a thermally conductive mold compound over the die and the substrate, and a heat spreader over the mold compound.

In further embodiments, the mold compound is filled with thermally conductive materials. The heat spreader is formed of a thermally conductive material, such a copper or aluminum.

Further embodiments include a thermally conductive via through the mold to connect the heat spreader to the substrate.

In further embodiments, the substrate comprises a ground plane and the heat spreader is coupled to the ground plane of the substrate.

Further embodiments include a plurality of heat fins thermally coupled to the heat spreader.

In further embodiments, the mold compound comprises a plurality of kerfs to allow the package to bend.

Some embodiments pertain to an electronic computing system that includes a power supply, a display, and a semiconductor computing device package having a substrate, a die on the substrate and connected to the substrate, a thermally conductive mold compound over the die and the substrate, and a heat spreader over the mold compound.

The invention claimed is:

1. A package comprising:
a plurality of silicon dies embedded in a flexible substrate;
a flexible interposer layer over the embedded dies;
a thin film thermal distribution layer over the substrate opposite the flexible interposer layer, the flexible substrate being shaped with the dies and the interposer to a curved shape and cured so that the flexible substrate holds its shape; and
a second plurality of silicon dies embedded in a second flexible substrate, the second flexible substrate being in electrical contact with the flexible interposer opposite the flexible substrate.

2. The package of claim 1, wherein at least one die of the plurality of silicon dies is stacked over another die.

3. The package of claim 1, further comprising a through-silicon via to connect the stacked die to another die.

4. The package of claim 1, wherein the flexible interposer comprises an embedded redistribution metal layer to provide an electrical path to the flexible substrate.

5. The package of claim 4, wherein the flexible interposer comprises an elastomer to carry the embedded redistribution metal layer.

6. The package of claim 1, wherein the flexible interposer comprises a plurality of alternating metal and dielectric layers.

7. The package of claim 1, wherein the thin film thermal distribution layer comprises a copper-based composite.

8. The package of claim 1, wherein the plurality of silicon dies are electrically coupled and bonded to the flexible interposer.

9. The package of claim 8, wherein the silicon dies are electrically coupled and bonded to the flexible interposer by surface-activated bonding or thermal compression bonding.

10. The package of claim 1, further comprising a thin film thermal distribution layer over the second substrate opposite the flexible interposer.

11. An electronic computing system comprising:
a power supply;
a display; and
a semiconductor computing device package having a plurality of silicon dies embedded in a flexible substrate, a flexible interposer layer over the embedded dies, and a thin film thermal distribution layer over the substrate opposite the flexible interposer layer, the flexible substrate being shaped with the dies and the interposer to a curved shape and cured so that the flexible substrate holds its shape, and the semiconductor computing device package further comprising a second plurality of silicon dies embedded in a second flexible substrate, the second flexible substrate being in electrical contact with the flexible interposer opposite the flexible substrate.

* * * * *